United States Patent
Donlin

(10) Patent No.: US 8,090,567 B1
(45) Date of Patent: Jan. 3, 2012

(54) SELF-DISABLING SIMULATION MODELS USING LIMITS ON ASSERTIONS

(75) Inventor: Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 423 days.

(21) Appl. No.: 12/393,914

(22) Filed: Feb. 26, 2009

(51) Int. Cl.
 *G06F 17/50* (2006.01)
(52) U.S. Cl. .......................................... 703/13; 703/17
(58) Field of Classification Search ............... 703/13, 703/15–17
 See application file for complete search history.

(56) References Cited

U.S. PATENT DOCUMENTS

| | | | |
|---|---|---|---|
| 6,591,402 B1 * | 7/2003 | Chandra et al. | 716/106 |
| 7,089,173 B1 | 8/2006 | Molson et al. | |
| 7,162,403 B2 | 1/2007 | Nouri et al. | |
| 7,225,416 B1 | 5/2007 | Pritchard et al. | |
| 7,231,627 B2 * | 6/2007 | Fong et al. | 716/102 |
| 7,404,160 B2 * | 7/2008 | Piper et al. | 716/106 |
| 2002/0199110 A1 | 12/2002 | Kean | |
| 2004/0093198 A1 | 5/2004 | Neifert et al. | |

OTHER PUBLICATIONS

Kuang-Chien (KC) Chen, "Tutorial (T-4) Assertion-Based Verification for SoC Designs", 2003, Mar. 2003 IEEE.*
U.S. Appl. No. 11/500,576, filed Aug. 8, 2006, Donlin.
Xilinx, Inc., "LogiCORE PCI-X v6.1," UG261, Jul. 13, 2006, p. 12, available from Xilinx, Inc., 2100 Logic Drive, San Jose, California 95124.
Russinoff, David M., *A Note on the IEEE Verilog Simulation Cycle*, Sep. 28, 2005, pp. 1-11, available from www.russinoff.com.
Velusamy, Shanthamoorthi et al., "Unified Modeling in C++ & SystemC," *Design & Reuse*, no publication date, downloaded Oct. 19, 2009, pp. 1-3, <http://www.design-reuse.com/articles/7222/unified-modeling-in-c-systemc.html>.

* cited by examiner

*Primary Examiner* — Kamini S Shah
*Assistant Examiner* — Herng-Der Day
(74) *Attorney, Agent, or Firm* — LeRoy D. Maunu; Lois D. Cartier

(57) ABSTRACT

Approaches for managing a simulation model. A processor-implemented method includes simulating an electronic system using the simulation model and a simulator. The simulation model includes an assertion test that has an associated limit. The simulator counts a number of times the assertion test is evaluated during simulation, which is the evaluation count. When the simulator determines that the evaluation count has reached the limit, the simulation is stopped.

7 Claims, 3 Drawing Sheets

US 8,090,567 B1

SELF-DISABLING SIMULATION MODELS USING LIMITS ON ASSERTIONS

FIELD OF THE INVENTION

The present invention generally relates to the simulation of logic circuit designs.

BACKGROUND

An electronic system design may include numerous design modules, and those design modules may be provided by different organizations. For example, a system designer may prepare some of the modules and obtain others of the modules under license from one or more commercial vendors. Well before the system is implemented, the system designer may evaluate vendors' modules for suitability with other modules of the system. This evaluation may be accomplished by simulating the designer's modules in combination with those provided by other parties.

Oftentimes vendors will provide simulation models for the modules to be evaluated. These models may be high-level models for functional verification or lower-level models for functional and performance verification. In some instances, preparing a suitable simulation model may entail a great deal of effort on the part of the vendor.

A vendor may recoup costs associated with preparing a simulation model with license fees later received for the underlying design. However, in some instances, the evaluator may have no intent to ever obtain a license for the module and may instead be developing a separate product and using the vendor's simulation model to demonstrate compatibility.

The present invention may address one or more of the above issues.

SUMMARY

The various embodiments of the invention provide approaches for managing a simulation model. In one embodiment, a processor-implemented method simulates an electronic system using the simulation model and a simulator. The simulation model includes an assertion test that has an associated limit. The simulator counts the number of times the assertion test is evaluated during simulation, which is an evaluation count. The simulator determines when the evaluation count has reached the limit and stops the simulation in response to the evaluation count reaching the limit. The simulating, counting, determining, and stopping are all implemented by the processor.

In another embodiment, an article of manufacture comprises a processor-readable storage medium configured with instructions for managing a simulation model. The instructions cause one or more processors to perform operations including simulating an electronic system using the simulation model and a simulator. The simulation model includes an assertion test that has an associated limit. The number of times the assertion test is evaluated during simulation, the evaluation count, is counted by the simulator. The simulator determines when the evaluation count has reached the limit and stops the simulation in response to the evaluation count reaching the limit.

A system for managing a simulation model is provided in another embodiment. The system comprises means for simulating an electronic system using the simulation model. The simulation model includes an assertion test that has an associated limit. Means are provided for counting a number of times the assertion test is evaluated during simulation, which is the evaluation count. The system includes means for determining when the evaluation count has reached the limit and means for stopping simulation in response to the evaluation count reaching the limit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Assertion-based verification (ABV) has become common for verifying hardware designs. In ABV, designers provide short descriptions of properties of their hardware designs that must hold true during simulation and for the final implementation. ABV is typically specified using an assertion language, which may be implemented separate from the hardware description language (HDL) or tightly integrated with the HDL. The Accellera Property Specification Language (PSL) is an example of a language that supports specification of assertion tests separate from the HDL specification of a design. SystemVerilog is a language that provides extensions to an HDL for specifying assertion tests.

The various embodiments of the invention use traces of assertions to control use of a simulation model. For example, a simulation model may be constrained for use for evaluation purposes only. Instead of limiting use of a simulation model by imposing a limit on the number of simulation clock cycles, the embodiments of the present invention limit use of a simulation model by way of one or more constraints associated with assertion tests specified for the design. As compared to the approach in which simulation is limited to a certain number of simulation clock cycles, the present invention allows the owner of the simulation model to control how the simulation model is used, thereby providing a finer degree of control. The embodiments of the invention further permit different constraints to be associated with different assertion tests, which allows the owner of the simulation model to individually control simulation of different paths of the model.

Still further embodiments of the invention support application of simulation constraints to sequences of assertions. Specifically, the simulation may be limited to some specified number of times that a sequence of assertions is evaluated. In this manner, the owner of the simulation model may control simulation by way of limiting the number of times a specific path of the design is permitted to execute.

Figure 1:
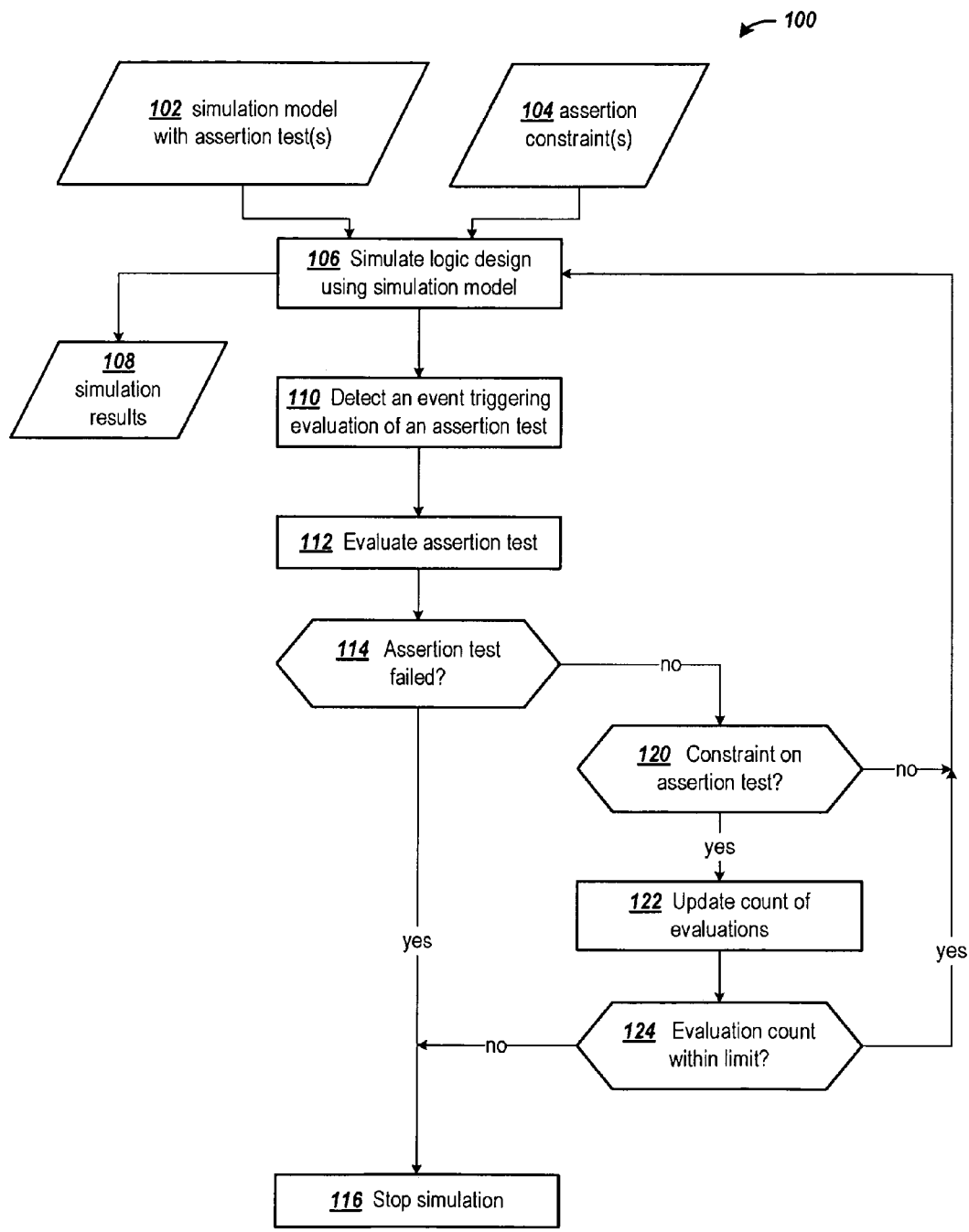
FIG. 1 is a flowchart of an example process for automatically disabling a simulation model based on a permitted number of evaluations of an assertion test in the model.

FIG. 1 is a flowchart of an example process 100 for automatically disabling a simulation model based on a permitted number of evaluations of an assertion test in the model. The process generally entails simulating a circuit design using a simulation model that has one or more assertion tests. One or more constraints are associated with one or more of the assertion tests. In an example embodiment, each constraint indicates a number of times that assertion test may be evaluated during the simulation. If a constrained assertion test is evaluated more than the specified number of times, the simulation is stopped.

A simulation model 102, including one or more test benches (not shown), and assertion constraints 104 are input to step 106, which simulates the logic design represented by the simulation model. The simulation outputs simulation results 108, for example, to a file or display screen. The simulation model may be of any type known to those skilled in the art and includes one or more assertion tests. The level of abstraction of the simulation model may be any level amenable to simulation, including, for example, a logic circuit design, a cycle accurate simulation model, or a transaction level simulation model.

In an example embodiment, the assertion constraints 104 are described separately from the simulation model 102, for example, in a stored file having license information. In one embodiment, the assertion constraint(s) reference the assertion test(s) in the simulation model by position in the hierarchical structure of the simulation model and/or a label directly attached to the assertion test declaration in the simulation model's source code. The assertion constraints may be protected with standard encryption and validation methods or hashing methods. In a related embodiment, an assertion constraint file may be limited for use with only one particular instance of a simulation model. Another protection measure that may be implemented is for the simulator to refuse to run the simulation model if an associated assertion constraint file is not provided as input.

The simulator of the logic design is adapted to recognize any constraints specified for the assertion tests. Steps 106, 110, 112, 114, 120, 122, and 124 are encompassed by the overall simulation process. At step 110, the simulator detects a simulation event that triggers evaluation of an assertion test, and the assertion test is evaluated at step 112. If the assertion test fails (decision step 114), the simulation may be stopped at step 116, and no further simulation results may be output.

If the assertion test passes at decision step 114, the simulation determines at step 120 whether or not there is a constraint associated with the assertion test. If so, the evaluation count associated with the assertion test is updated at step 122. Depending on implementation requirements and/or choices, the count may indicate either the number of permitted evaluations remaining or the number of evaluations performed for the assertion test in the simulation. If the evaluation count for the assertion test is within the permitted limit (step 124), the process returns to step 106 to continue the simulation. Otherwise, the simulation is stopped at step 116.

In one embodiment, each simulation run may start with a new evaluation count for each constrained assertion test. A simulation run is recognized as beginning simulation of a circuit design from a power-on/reset state, or from some other user-specified state, and continuing until the user or simulator stops the simulation. A new simulation run commences when the user again commences simulation with the same simulation model, either from an initial power-on/reset state or some other user-specified state. In another embodiment, evaluation count(s) may be accumulated for each assertion test across multiple simulation runs. In an embodiment in which the evaluation count(s) is stored across multiple simulation runs, the simulator inputs the stored evaluation count(s) and checks the evaluation count(s) against the limit specified in the input assertion constraint(s) 104. If the input evaluation count(s) is not within the limit, the simulation is not started. Thus, the simulator performs these checks prior to the simulating step 106.

In addition to, or in place of, simulation control provided by way of constraints associated with individual assertion tests, another embodiment of the invention provides simulation control by limiting the number of times a sequence of assertion tests is evaluated during the simulation. In applying an assertion constraint to a sequence of assertion tests, the simulator tracks the evaluation of assertion tests from a specified starting assertion test (e.g., a write to a register) to a specified terminating assertion test. The assertion tests that comprise each sequence are specified in a table, with each assertion test between the starting assertion test and the terminating assertion tests being referred to as an intervening assertion test. Evaluation counts for the assertion tests in a sequence are updated when the terminating assertion test is evaluated.

Figure 2:
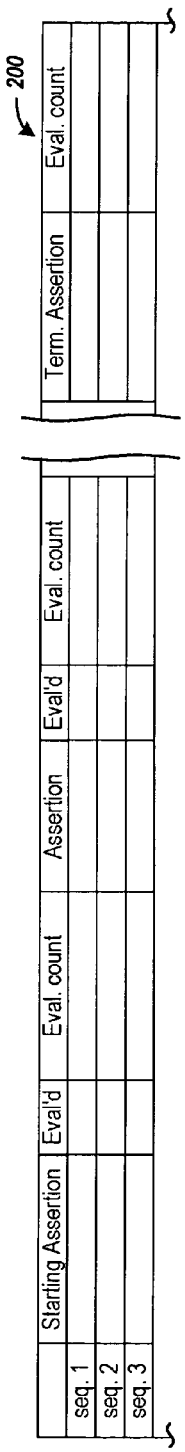
FIG. 2 shows an example table of information used in controlling the automatic disabling of a simulation model based on a permitted number of evaluations of one or more sequences of assertions tests.

FIG. 2 shows an example table 200 of information used in controlling the automatic disabling of a simulation model based on a permitted number of evaluations of one or more sequences of assertion tests. Each row in the table contains information that defines and controls one of the specified sequences of assertions. Rows are shown for example sequences 1, 2, and 3. The columns contain the information for the sequences.

Generally, each sequence is specified as including some desired number of assertion tests. Each of the specified assertion tests in a sequence has an associated Evaluated (Eval'd) flag that indicates whether or not the assertion test has been evaluated and an Evaluation count (Eval. count) that indicates the number of permitted evaluations remaining. The Starting Assertion specifies the first assertion test of a sequence, and the Terminating Assertion is the assertion test that when evaluated indicates that the sequence is complete. Note that no Evaluated flag is needed for the Terminating Assertion, as will become apparent from the description of FIG. 3.

Figure 3:
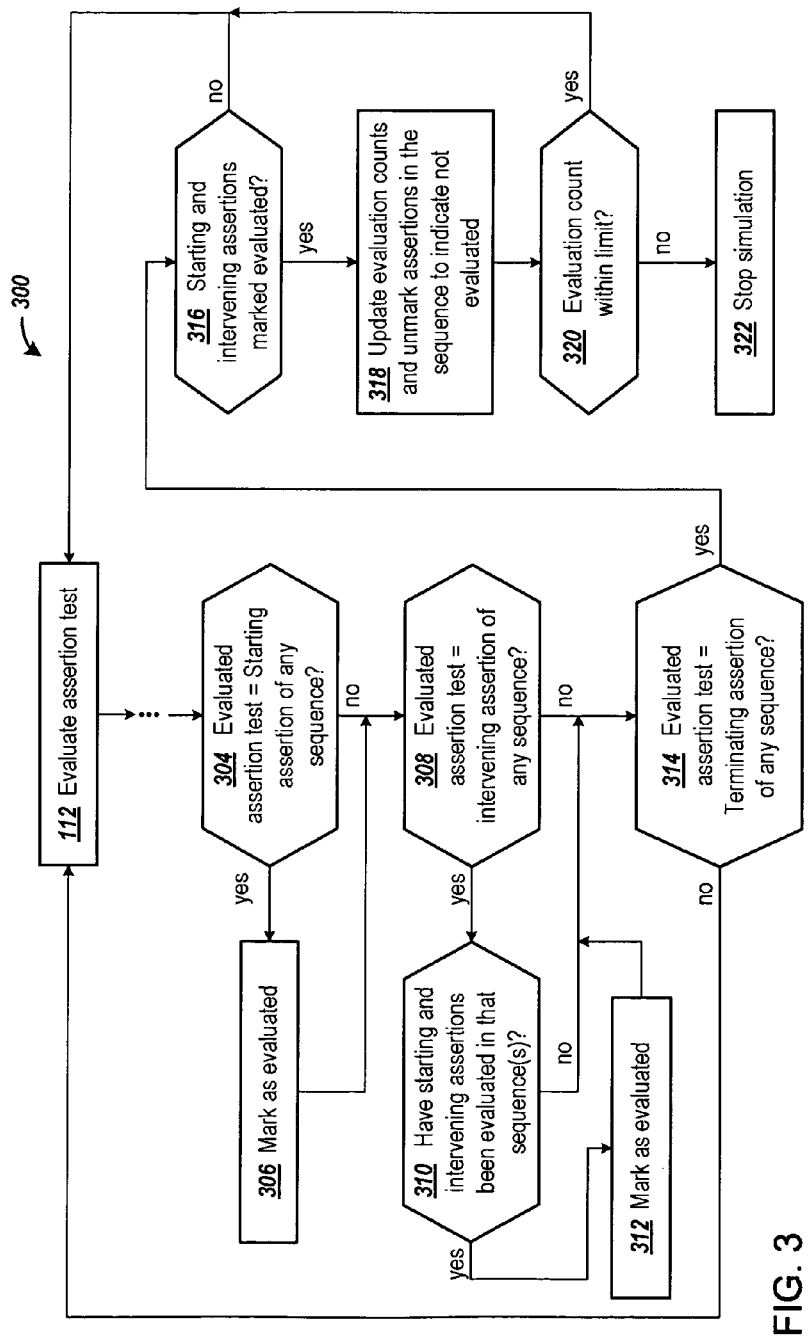
FIG. 3 is a flowchart of an example process for handling sequences of assertion tests to control simulation in accordance with various embodiments of the invention.

FIG. 3 is a flowchart of an example process 300 for handling sequences of assertion tests to control simulation in accordance with various embodiments of the invention. The controlling of a simulation with sequences of assertion tests may be used alone or in combination with controlling the simulation using individual assertion tests as described above in regards to FIG. 1.

In addition to, or in place of, evaluating an assertion test at step 112 (described in FIG. 1), the simulator determines whether or not the evaluated assertion test is part of one of the specified sequences of assertions from table 200 (FIG. 2). At step 304, the process tests whether or not the evaluated assertion test is the Starting Assertion (FIG. 2) of any of the specified sequences. If so, the matching starting assertion in each sequence is marked as evaluated at step 306 (Evaluated flag in FIG. 2). Since an assertion test may be part of more than one sequence, the process continues at decision step 308.

If the evaluated assertion test is not a Starting Assertion, decision step 308 tests whether or not the evaluated assertion test is an intervening assertion in any of the sequences. If so, the process then checks at step 310 whether or not the matching sequence is in progress by checking the Evaluated flags of the Starting Assertion and any intervening assertion tests of the matching sequence. The intervening assertion tests must also be checked, since an in-order evaluation of the assertion tests in a sequence is expected for an assertion test to qualify as a match in the sequence. If the sequence is in progress, the Evaluated flag for that intervening assertion test is marked as evaluated at step 312, and the process continues at step 314.

Since an assertion test may be part of more than one sequence, the process continues at decision step 314 for checking for a matching Terminating Assertion test.

Decision step 314 tests whether or not the evaluated assertion test is a terminating assertion of any of the sequences. For a terminating assertion, the process proceeds to step 316 to test whether the Starting Assertion and all intervening assertions in the matching sequence are marked as evaluated. If so, the Evaluation counts are updated for each of the assertion tests specified in the sequence, and the Evaluated flags for the assertions in the sequence are unmarked to indicate that the sequence is no longer in progress (step 318).

At decision step 320, the process checks whether or not the evaluation count for the sequence is within a limit. In one embodiment, the Evaluation count of the Terminating Assertion may be used to count down from a specified number to 0. Once the count reaches 0, the limit has been reached. If the sequence of assertion tests has been performed the permitted number of times, the simulation is stopped at step 322, and no further simulation results may be output. Otherwise, the process returns to the simulation flow (e.g., step 106 of FIG. 1), which eventually may lead to evaluating another assertion test at step 112.

If decision step 316 finds any assertion tests in the sequence not marked as evaluated, the process returns to the simulation flow (e.g., step 106 of FIG. 1) as described above. Similarly, decision step 314 continues the simulation as described if the evaluated assertion test does not match any assertion test in any of the sequences.

Figure 4:
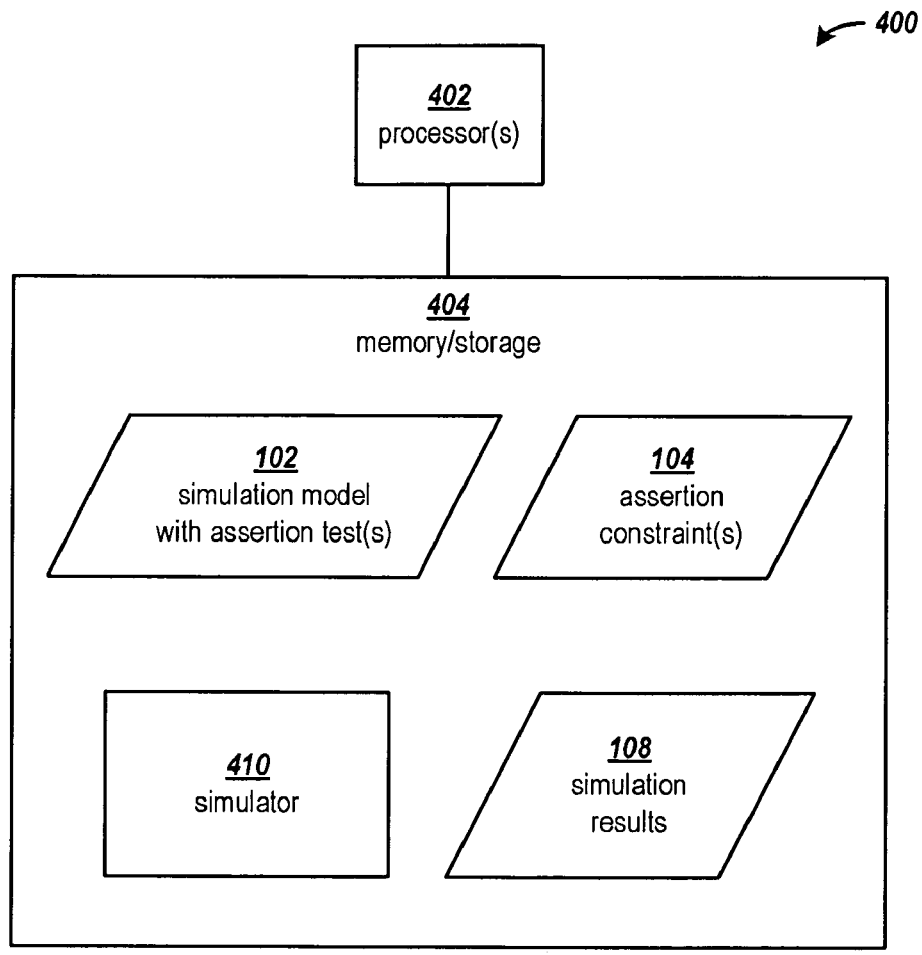
FIG. 4 is a block diagram of an example computing arrangement on which the processes described herein may be implemented.

FIG. 4 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. In addition, program code that implements the processes may be provided via a variety of computer-readable storage media or delivery channels such as magnetic or optical disks or tapes, or electronic storage devices, for example.

Computing arrangement 400 includes one or more processors 402 coupled to a memory/storage arrangement 404. The architecture of the computing arrangement depends on implementation requirements, as would be recognized by those skilled in the art. The processor 402 may be one or more general purpose processors, or a combination of one or more general purpose processors and suitable co-processors, or one or more specialized processors (e.g., RISC, pipelined, etc.).

The memory/storage arrangement 404 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement 402 executes the software stored in memory/storage arrangement 404, and reads data from and stores data to the memory/storage arrangement according to the processes described above. An operating system (not shown) manages the resources of the computing arrangement.

The simulator 410 generally simulates a circuit design as specified by the input simulation model 102. In performing the processes described herein, the simulator inputs the assertion constraints 104 for controlling use of the simulation model and generates and outputs/stores simulation result data 108. In controlling the simulation as described herein, the simulator further inputs assertion constraints 104. The simulator stores intermediate data, which is used in evaluating the assertion tests and controlling the simulation in memory/storage arrangement 404. Such intermediate data can include, for example, the evaluation counts for individually constrained assertion tests along with the table 200 for controlling sequences of assertion tests.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for managing a simulation model, the method comprising:

checking by a simulator for presence of a constraint file to input, the constraint file containing data specifying an assertion test relating to a design of an electronic system and further specifying an associated limit;

refusing by the simulator to simulate using the simulation model in response to absence of the constraint file;

simulating the electronic system using the simulation model and the constraint file by the simulator;

counting a number of times the assertion test is evaluated during simulation by the simulator, the number of times being an evaluation count;

determining by the simulator when the evaluation count has reached the limit; and stopping simulation with the simulation model by the simulator in response to the evaluation count reaching the limit, wherein the checking, the refusing, the simulating, the counting, the determining, and the stopping are implemented by the processor.

2. The method of claim 1, further comprising:

inputting to the simulator, data indicating a plurality of limits associated with a plurality of assertion tests;

wherein the counting includes counting respective numbers of times the plurality of assertion tests are evaluated, the respective numbers of times being respective evaluation counts;

wherein the determining includes determining when each respective evaluation count has reached its associated limit; and wherein the stopping includes stopping simulation in response to any one of the respective evaluation counts reaching its associated limit.

3. The method of claim 1, further comprising:

storing the evaluation count after stopping the simulation in response to a control other than the evaluation count reaching the limit;

inputting the stored evaluation count upon starting the simulating; and wherein the counting includes starting the counting with the stored evaluation count.

4. An article of manufacture, comprising:

a non-transitory processor-readable storage medium configured with instructions for managing a simulation model, wherein execution of the instructions by one or more processors causes the one or more processors to perform operations including:

checking by a simulator for presence of a constraint file to input, the constraint file containing data specifying an assertion test relating to a design of an electronic system and further specifying an associated limit;

refusing by the simulator to simulate using the simulation model in response to absence of the constraint file;

simulating the electronic system using the simulation model and the constraint file by the simulator;

counting a number of times the assertion test is evaluated during simulation by the simulator, the number of times being an evaluation count;

determining by the simulator when the evaluation count has reached the limit; and stopping simulation with the simulation model by the simulator in response to the evaluation count reaching the limit.

5. The article of manufacture of claim 4, the operations further including:

inputting to the simulator, data indicating a plurality of limits associated with a plurality of assertion tests;

wherein the counting includes counting respective numbers of times the plurality of assertion tests are evaluated, the respective numbers of times being respective evaluation counts;

wherein the determining includes determining when each respective evaluation count has reached its associated limit; and wherein the stopping includes stopping simulation in response to any one of the respective evaluation counts reaching its associated limit.

6. The article of manufacture of claim 4, the operations further including:

storing the evaluation count after stopping the simulation in response to a control other than the evaluation count reaching the limit;

inputting the stored evaluation count upon starting the simulating; and wherein the counting includes starting the counting with the stored evaluation count.

7. A system for managing a simulation model, comprising:

one or more processors;

a memory arrangement coupled to the one or more processors and configured with program code that when executed by the one or more processors causes the one or more processors to perform operations including:

checking by a simulator for presence of a constraint file to input, the constraint file containing data specifying an assertion test relating to a design of an electronic system and further specifying an associated limit;

refusing by the simulator to simulate using the simulation model in response to absence of the constraint file;

simulating the electronic system using the simulation model and the constraint file by the simulator;

counting a number of times the assertion test is evaluated during simulation, the number of times being an evaluation count;

determining when the evaluation count has reached the limit; and stopping simulation with the simulation model in response to the evaluation count reaching the limit.

* * * * *